United States Patent [19]
Jansen et al.

[11] Patent Number: 5,627,435
[45] Date of Patent: May 6, 1997

[54] HOLLOW CATHODE ARRAY AND METHOD OF CLEANING SHEET STOCK THEREWITH

[75] Inventors: Frank Jansen, Walnut Creek, Calif.; Steven K. Krommenhoek, Madison, N.J.; Abraham I. Belkind, North Plainfield, N.J.; Zoltan Orban, Jr., Franklin Park, N.J.

[73] Assignee: The BOC Group, Inc., Murray Hill, N.J.

[21] Appl. No.: 601,888

[22] Filed: Feb. 15, 1996

Related U.S. Application Data

[63] Continuation of Ser. No. 89,875, Jul. 12, 1993, abandoned.
[51] Int. Cl.$^6$ .......................................................... H01P 5/12
[52] U.S. Cl. ........................ 315/111.21; 315/111.41; 118/723 R; 118/723 MA; 156/345; 216/71
[58] Field of Search ..................... 315/111.21, 111.41; 118/723 R, 723 MA, 723 E; 156/345, 643

[56] References Cited

U.S. PATENT DOCUMENTS

| | | | |
|---|---|---|---|
| 4,132,613 | 1/1979 | Penfold et al. | 315/267 |
| 4,209,357 | 6/1980 | Gorin et al. | 156/643 |
| 4,892,753 | 1/1990 | Wang et al. | 427/38 |
| 4,969,415 | 11/1990 | Bartha et al. | 118/723 |
| 5,007,373 | 4/1991 | Legg et al. | 118/723 |
| 5,009,738 | 4/1991 | Gruenwald et al. | 156/345 |
| 5,032,202 | 7/1991 | Tsai et al. | 118/723 MA |
| 5,292,401 | 3/1994 | Yoneda | 118/723 E |
| 5,336,326 | 8/1994 | Karner et al. | 118/723 HC |

FOREIGN PATENT DOCUMENTS

| | | | |
|---|---|---|---|
| 0210858A3 | 7/1986 | Japan . | |
| 63-58924 | 3/1988 | Japan . | |
| 0058924 | 3/1988 | Japan | 118/723 E |
| 3290274 | 11/1988 | Japan | 118/723 E |

OTHER PUBLICATIONS

Patent Abstracts of Japan, vol. 14, No. 244 (E-932) 24 May 1990 & JP-A-02 066 941 (NEC Corp) 7 Mar. 1990, Takeshiro Shinichi *abstract*.
Proceedings of the CIP 93, 6-11 Jun. 1993, 6 Jun. 1993, Abtibes (FR) O. Kessi et al., "Comportment et performances d'un réacteur triode multipolaire à cathode creuse excité à 13,56 MHz et opérant avec SF6." *the whole document* and translation.
IBM Technical Disclosure Bulletin, vol. 28, No. 10, Mar. 1986, New York US, pp. 4294-4297, Anonymous "Hollow cathode-enhanced RF sputtering system".
Journal of Applied Physics, vol. 66, No. 10, 15 Nov. 1989, New York, USA, pp. 4676-4684, P.J. Kung et al., "Growth of diamond thin films by spiral hollow cathode plasma-assisted chemical vapor deposition".
Tanaka et al, "Effect of magnetic field on the characteristics of a hollow cathode ion source", Rev. Sci. Instrum. 54(9), Sep. 1983 pp. 1104-1112.
Jansen et al, "Plasma enhanced chemical vapor deposition using forced flow through hollow cathodes", J. Vac. Sci. Technol. A7(6), Nov./Dec. 1989 pp. 3176-3182.

Primary Examiner—Robert Pascal
Assistant Examiner—Darius Gambino
Attorney, Agent, or Firm—David A. Draegert; Salvatore P. Pace

[57] ABSTRACT

An array of hollow cathodes can be made by mounting a housing connected to a source of plasma precursor gas and to a source of power in a vacuum chamber, said housing having a plurality of uniformly spaced openings in a wall thereof into which a plasma can be generated. A substrate to be treated is mounted parallel to and spaced a preselected distance from said openings. In operation, a plurality of plasma torches is created extending from the openings which can plasma etch and remove coatings on said substrate.

14 Claims, 6 Drawing Sheets

HOLLOW CATHODE ARRAY AND METHOD OF CLEANING SHEET STOCK THEREWITH

This is a continuation of application Ser. No. 08/089,875, filed Jul. 12, 1993, now abandoned.

TECHNICAL FIELD

This invention relates to a novel hollow cathode array. More particularly, this invention relates to a hollow cathode array for generating a plasma and to a method of treating substrate surfaces therewith.

BACKGROUND OF THE INVENTION

Metal sheet stock, such as cold rolled or stainless steel or other iron stock or alloys, aluminum and aluminum alloy foil and sheet, copper and copper alloy foil and sheet and the like, is rolled to a thin gauge using oil as a pressure transfer medium ("rolling oil"). Metals subject to oxidation upon exposure to oxygen and moisture in the atmosphere are often protected from oxidation during storage by additional oils, greases and other hydrocarbon coatings ("shipping oils"). However, these coatings must be removed prior to application of more permanent coatings such as paint, chromium and the like.

Sheet steel that has been coated with organic materials including hydrocarbons can be cleaned by immersing in a solvent cleaner, such as perchloroethylene, but such solvents are increasingly difficult and expensive to dispose of safely.

Removal of materials such as oxides and hydrocarbons from metal surfaces can also be done by plasma cleaning, but this is generally expensive and large sheet cannot be accommodated in conventional plasma etch equipment at practicable rates.

Thus a practical method of cleaning sheet metal stock to remove organics and other coatings rapidly and inexpensively with a plasma continues to be sought.

SUMMARY OF THE INVENTION

We have found that a hollow cathode array can be made and is a plasma source that is useful to treat the surface of various materials including sheet metal stock.

The hollow cathode array system useful herein comprises a housing having a plurality of uniformly spaced openings along one wall thereof, the size of the openings and the thickness of the housing wall chosen so that a plasma can be generated in and emitted from said openings, in effect obtaining an array of hollow cathodes. The hollow cathode array is mounted inside a vacuum chamber. A substrate to be treated is mounted parallel to the hollow cathode array openings at a preselected distance therefrom.

Magnetic enhancement can be used to focus the plasma as it exits the openings by placing a magnet assembly beneath or above the substrate. Alternatively, a magnet assembly of opposite polarity can be placed both beneath the substrate and above the housing.

The hollow cathode array of the invention can be used to clean sheet material by passing the sheet stock beneath the hollow cathode array while passing a suitable plasma precursor gas into the housing which is connected to a source of power, which can be either a DC or AC source. The electrical power and gas flow rates are adjusted so as to form an intense plasma discharge in all of the openings of the housing. By proper choice of the diameter and spacing of the openings, the thickness of the housing at the location of the openings, the gas pressure inside the hollow cathode housing and the power, the hollow cathode array of the invention can be scaled to any size. Thus wide sheets of material such as metal rolling stock and foils can be uniformly plasma treated, using plasma precursor gases that can etch or react with surface materials including oxides and hydrocarbons, to remove them from the sheet surface.

DETAILED DESCRIPTION OF THE INVENTION

Figure 1:
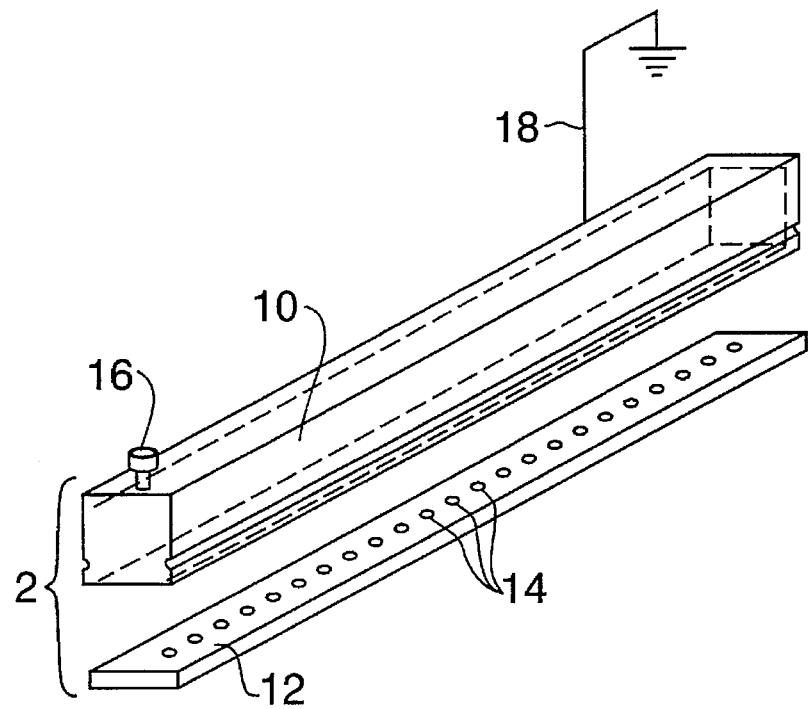
FIG. 1 is an exploded, schematic view of the apparatus of the invention useful herein.

In the discussion of the Figures, like numerals for like parts are used throughout.

The hollow cathode array useful herein can be described with reference to FIG. 1. The hollow cathode array 2 comprises a housing 10 including a base plate 12 having a plurality of uniformly spaced openings 14 therethrough. A plasma precursor gas is supplied to the housing 10 from an inlet port 16. A source of power 18 is also connected to the housing 10. The housing 10 is mounted in a vacuum chamber 20, as shown in FIG. 2. A cooling chamber 23 for the circulation of water or other coolant in pipe 25 is fitted to one or more walls 11 of the housing 10. A substrate 22 to be treated is also mounted beneath and parallel to the base plate 12. The substrate 22 can be mounted on a conveyor and passed beneath one or more base plates 12. Alternatively, the substrate may be passed beneath one or more base plates 12 by unwinding strip metal from a reel placed either inside or outside the vacuum chamber 20 and winding it after passage under the base plates on another reel. In the event that the reels are placed outside of the vacuum system 20, sophisticated airlocks of known design can be employed to feed the metal strip into and out of the vacuum chamber 20. The vacuum chamber 20 has an exhaust port 24 connected to a vacuum pump (not shown).

Figure 2:
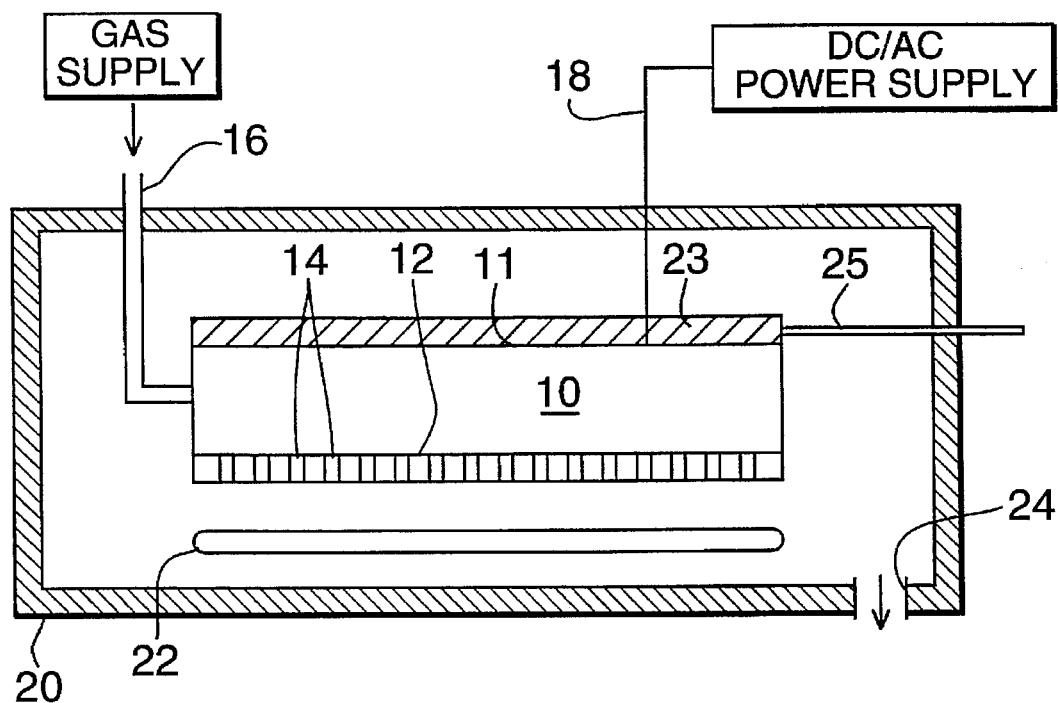
FIG. 2 is a cross sectional, schematic view of an array of hollow cathodes mounted in a vacuum chamber.
Figure 3:
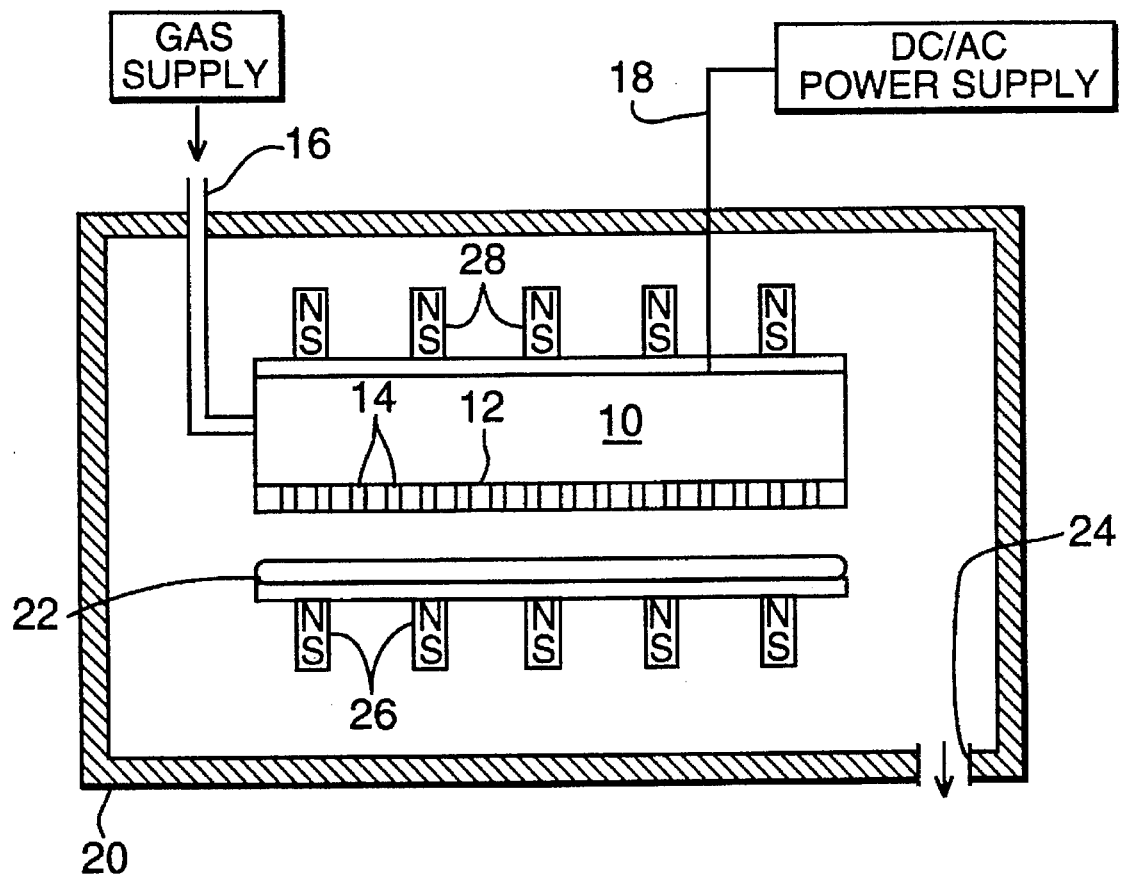
FIG. 3 is a cross sectional, schematic view of an alternate embodiment of a hollow cathode array mounted in a vacuum chamber.

FIG. 3 illustrates an alternate embodiment of a hollow cathode of FIG. 1 in a vacuum chamber that includes a magnet assembly 26 to enhance the plasma etch rate of the substrate 22. The magnet assembly 26 mounted beneath or above the substrate 22 acts to focus the plasma generated in the openings 14 towards the substrate 22, and to increase the proportion of reactive particles in the plasma, thereby increasing the etch rate for a given hollow cathode geometry and power. The magnet assembly 26 can be mounted beneath or above the substrate 22; alternatively a first magnet assembly 26 can be mounted below the substrate 22 and a second magnet assembly 28 can be mounted above the housing 10, in which case the magnet assemblies 26 and 28 will be of opposite polarity. The magnet assemblies 26 and 28 can comprise a plurality of bar magnets, for example. The improved results obtained by magnetic enhancement of the hollow cathodes of the invention will be further described hereinbelow.

In order for the above apparatus to function as an array of hollow cathodes, a) the discharge power or the current and 2) the gas flow must be above a minimum level for the size of the housing 10 and the diameter and the length of the openings 14 in the base plate 12.

If the power is too low, e.g., below about 500 watts, the housing acts as a glow discharge bar, showing a large increase in discharge voltage with increasing power. For a 16 inch long, 1/4 inch thick base plate with 32 openings spaced 0.5 inch apart and having a diameter of 1/16 inch, when the power is increased above 500 watts, the tube switches to the hollow cathode mode, although at this power level the plasma discharge is not stable and not all of the openings operate at the same discharge intensity; some flickering is noted in the openings. At over 1500 watts of power however, the plasma discharge becomes stable and intense discharges visibly emerge from every opening. The planar intensity continues to increase with increasing power. Stable hollow cathode discharge operation is generally obtained at power levels of about 3 kilowatts. Use of higher power requires efficient cooling of the housing to prevent arcing in the openings.

In the case of the present hollow cathode array, a pressure difference is maintained over the hollow cathode openings by flowing the plasma precursor gas at a predetermined rate into the hollow cathode housing. For the hollow cathode to function properly, there is a minimum pressure required of the precursor gas inside the housing.

The minimum pressure required depends upon the diameter of the openings 14 in the base plate 12. The diameter of each opening 14 must be at least two times the cathode dark space associated with a glow discharge. The cathode dark space is inversely proportional to the pressure; thus the higher the pressure, the smaller the dark space, and the smaller the opening 14 can be and still have a discharge start inside each of the openings 14. For example, desirably the gas flow should be sufficient to obtain a gas pressure inside the housing generally of from about 0.1 about 5.0 Torr. At this pressure or higher, the dark space of the discharge becomes so small that the discharge can now exist in, for example, a 1/16 inch diameter opening.

The housing of the hollow cathode array of the invention can be made of a metal, for example aluminum, titanium, stainless steel, copper, tungsten, platinum, chromium, nickel, zirconium, molybdenum or alloys thereof with each other or other known elements, and will have a plurality of uniformly spaced openings along the length of one wall. The housing also can be made in sections by joining a base plate to an open housing, as shown in FIG. 1. The openings can be of variable diameter, but as discussed further in the Examples below, openings about 1/16 inch in diameter in a 1/8 inch thick stainless steel base plate gave excellent results.

The plasma precursor gases employed will be chosen for the treatment to be provided by the plasma. For cleaning operations, the plasma precursor gases can be for example nitrogen, hydrogen, oxygen, ozone, nitrous oxide, argon, helium and the like; and mixtures such as air (oxygen and nitrogen), mixtures of oxygen and hydrogen, oxygen and helium and the like. Other known etch gases such as halides and halocarbons can also be employed as the plasma precursor gas. For etch cleaning to remove hydrocarbons from a surface, reactive oxygen (excited molecules or atoms) is formed in the housing openings and reacts with the hydrocarbon molecules such as oils to break them up into fragments; the fragments are generally more volatile than the original hydrocarbons and at the least they can be more easily vaporized; the resultant volatile materials are pumped away in the system exhaust system.

Figure 4:
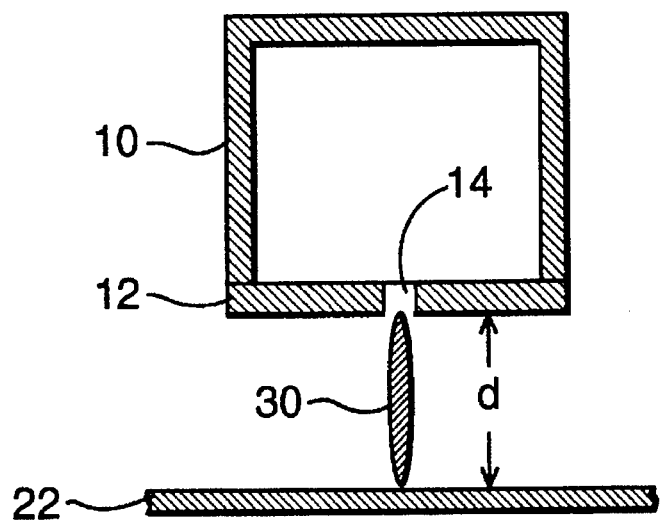
FIG. 4 is a schematic view of a single hollow cathode opening and substrate with a plasma discharge between them.

Another factor that must be considered to get good cleaning of a substrate is the distance between the discharge emitted below the base plate 12, or torch length 30 of the plasma discharge, and the substrate 22, as shown in FIG. 4. If the pressure in the housing 10 is too high, the length of the plasma discharge emission or torch 30 becomes very short. The distance "d" between the base plate 12 and the substrate 22 must be maintained within a distance so that adequate cleaning can occur. Suitably this distance is between about 0.5 to 1.5 inch.

In order to control the temperature of the housing 12, the hollow cathode array 10 can be encased in a water cooled jacket 23 or other conventional cooling means. A water cooled jacket 23 can be affixed to the housing 10 or to the base plate 12, or both. Gas and water mist cooling means can also be used to adjust the temperature of the housing 10 and the base plate 12. Lowering the temperature of the base plate 12 allows higher power to be applied to the hollow cathode array 2, and faster line speeds of the substrate to be cleaned.

In order to further improve the speed of passage of rolling stock beneath the hollow cathode array, the metal stock to be treated can be grounded, in which case the plasma will increase the temperature of the substrate due to dissipation of applied cathode power through the substrate. The resultant increase in temperature of the substrate enhances the volatilization of low molecular weight hydrocarbons. Thus the speed of passage of the metal sheet to be plasma cleaned can be increased by grounding the metal sheet and by increasing the power, which can be done if efficient cooling of the base plate or housing is provided. Conveyor speeds of greater than 300 feet/min can be readily achieved using a plurality of hollow cathode arrays of the invention.

Figure 5:
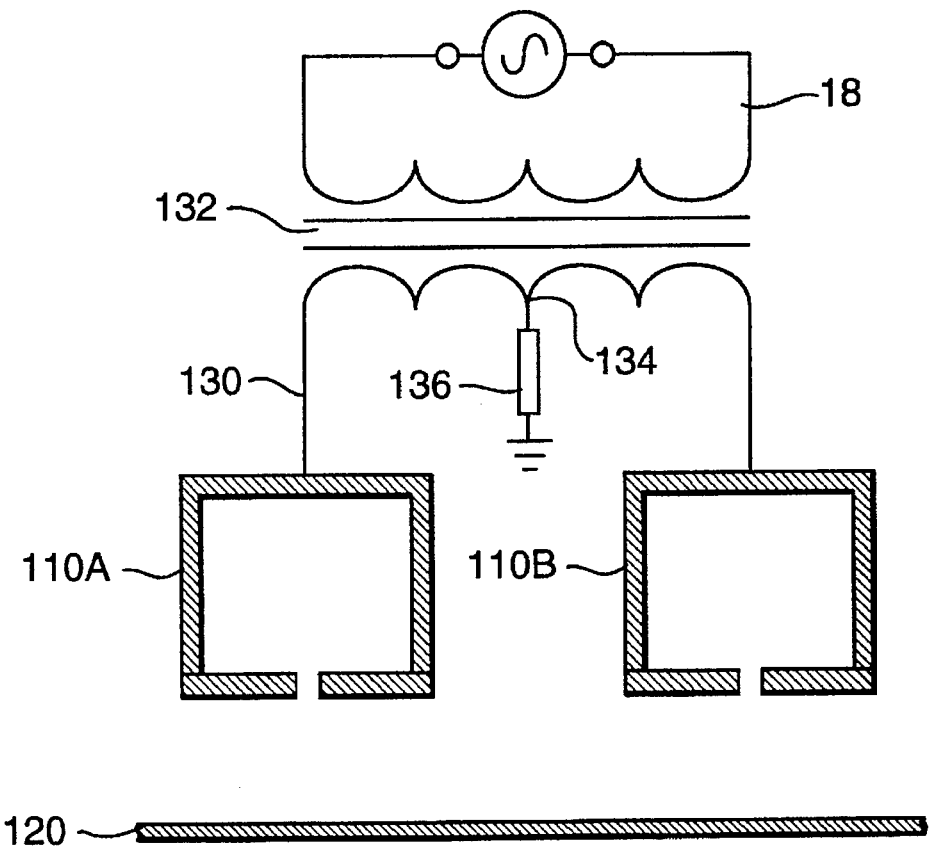
FIG. 5 is a schematic view illustrating an AC power connection that allows cleaning of insulating substrates.

When two or more hollow cathode arrays 2 are connected together, a single phase AC power source can be used by connecting the two cathodes to a secondary coil of an isolation transformer. The mid-point of the secondary coil can be connected to ground through an impedance, or can be shorted to ground, or not connected at all. As shown in FIG. 5, two hollow cathodes 110A and 110B are connected to a secondary coil 130 of a transformer 132. The mid-point 134 of the secondary coil 130 is connected to ground through an impedance 136. By varying the impedance, the plasma potential can be changed, thereby controlling the intensity of ion bombardment of the grounded substrate 120. The AC power source can have a frequency of from about 50 cycles/sec to about 50 Megacycles/sec for example, but the preferred frequency is from about 60–100 kilohertz.

The invention will be further described in the following Examples, but the invention is not meant to be limited to the details described therein.

EXAMPLE 1

A 1/8 inch thick stainless steel base plate about 16 inches long and having 65 1/16 inch openings spaced 1/8 inch apart was employed in a hollow cathode array configuration as in FIG. 3. A magnet assembly 26 comprising 8 sets of 3 magnets in a row was placed one inch below the electrically floating substrate, which was mounted one inch below the base plate. This produced a magnetic field of about 250 Gauss above the base plate 12. The vacuum chamber 20 was evacuated and a flow of oxygen gas started in the housing 10. The pressure in the chamber was maintained at 0.6 Torr. Using a DC power source, a stable hollow cathode plasma discharge was obtained in all 65 openings using a current of 1.2 to 6 Amps.

Plasma cleaning of 5 mil thick aluminum foil was carried out by the above hollow cathode array. The cleaning effectiveness of the treated aluminum foil was determined by measuring the contact angle with clean water. Whereas pure sputtered aluminum on a glass substrate has a contact angle of about 3°, untreated aluminum foil has a contact angle of about 85°–95° due to the presence of hydrocarbons on the surface. A contact angle of about 10° or less is indicative of a clean surface and is highly desirable.

Figure 6:
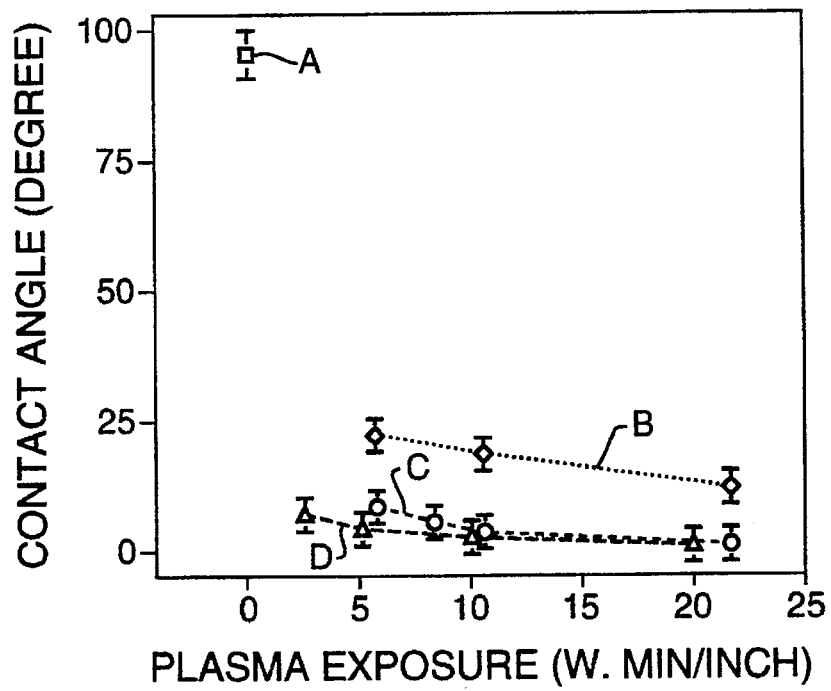
FIG. 6 is a graph of contact angle in degrees versus plasma exposure.

Aluminum foil was passed beneath the hollow cathode as above at various speeds, summarized in FIG. 6. FIG. 6 is a graph of contact angle versus line speed in min/in. Lowering the line speed increases the time the foil is exposed to the plasma from the hollow cathode array, and, as would be expected, reduces the contact angle, or improves the cleaning of the foil.

In FIG. 6, A is the contact angle of the aluminum foil as received. Line B is the contact angle variation obtained when an electrically floating stainless steel base plate was used with DC power. Line C is the contact angle variation obtained when a grounded stainless steel base plate was used with DC power. Line D is the contact angle variation obtained when a grounded aluminum base plate was used with AC power.

Although excellent results were obtained using 1 ft/min of line speed and 2 KW of DC power, this speed is rather slow. To increase the line speed, increased power must be supplied to the hollow cathode array. Table I below summarizes the contact angles obtained at various power levels and line speeds using electrically floating aluminum sheets.

TABLE I

| Sample | Power kW) | Conveyor speed (in/min) | Plasma Exposure W.min/in | Contact Angle, degrees |
|---|---|---|---|---|
| 1 | 1.06 | 200 | 5.3 | 22 +/− 3 |
| 2 | 1.06 | 100 | 10.6 | 18 +/− 3 |
| 3 | 2.17 | 100 | 21.7 | 11 +/− 3 |
| 4 | 2.17 | 23.5 | 173.6 | 0 |

Thus an acceptable contact angle of about 10 degrees was obtained at a plasma exposure of 21.7 W.min/in.

EXAMPLE 2

This example illustrates the variation of plasma intensity with the power applied to the hollow cathode array, with and without magnetic enhancement.

The amount of atomic oxygen generated from an oxygen plasma by a hollow cathode of Example 1, (system A) was measured at different power levels, measuring the intensity of oxygen emission (777 nm). When DC power was used, the highest emission was noted using a 1/8 inch thick stainless steel base plate with 1/16 inch diameter openings at a chamber pressure of 0.3 Torr. Similar results were obtained using a base plate having 32 openings 1/2 inch apart (system B).

Figure 7A:
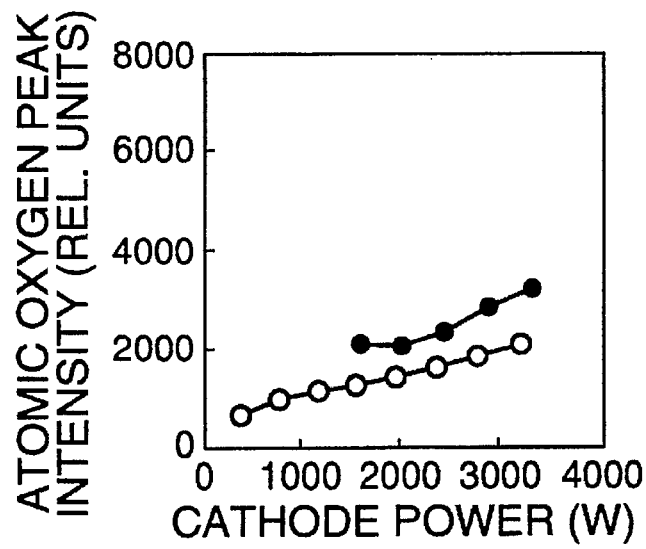
FIG. 7A is a graph of atomic oxygen emission versus cathode power without using magnets.
Figure 7B:
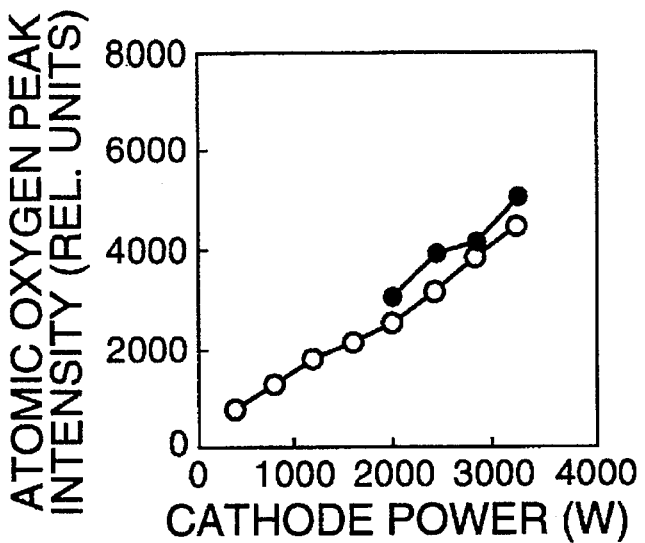
FIG. 7B is a graph of atomic oxygen emission versus cathode power using a single magnet assembly beneath the substrate.
Figure 7C:
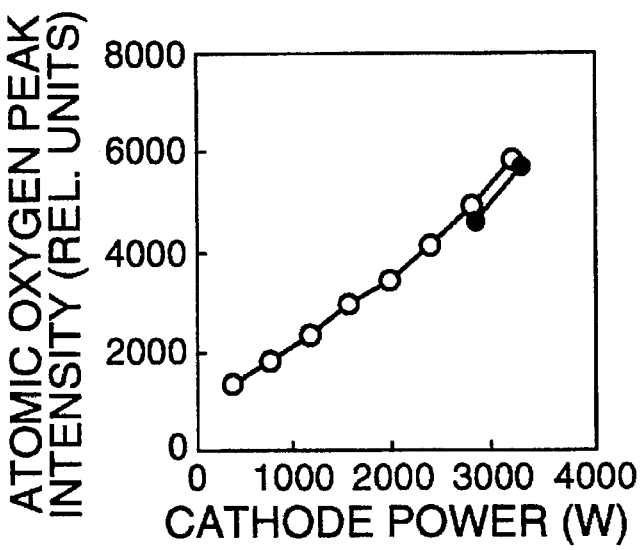
FIG. 7C is a graph of atomic oxygen emission versus cathode power using two sets of magnet assemblies both above and beneath the substrate.

FIG. 7 is a graph of emission spectra versus cathode power without using magnets (FIG. 7A); using a single magnet assembly beneath the substrate (FIG. 7B); and using two sets of magnet assemblies, one beneath the substrate and another above the housing (FIG. 7C). It is apparent that the use of magnet assemblies increases the generation of atomic oxygen by about two times. FIGS. 7A, 7B and 7C also illustrate that higher cathode power is required to sustain a hollow cathode discharge in an array of 65 openings (system A), shown as closed circles, than in an array of 32 openings (system B), shown as open circles.

EXAMPLE 3

A 1/4 inch thick aluminum base plate with 32 3/32 inch diameter openings was used to operate a hollow cathode discharge at a pressure varying from about 0.3 Torr to 0.6 Torr and AC power in the range between 500 W and 3000 W. The atomic oxygen line intensity versus power was similar to using a stainless steel base plate and DC power.

Figure 8A:
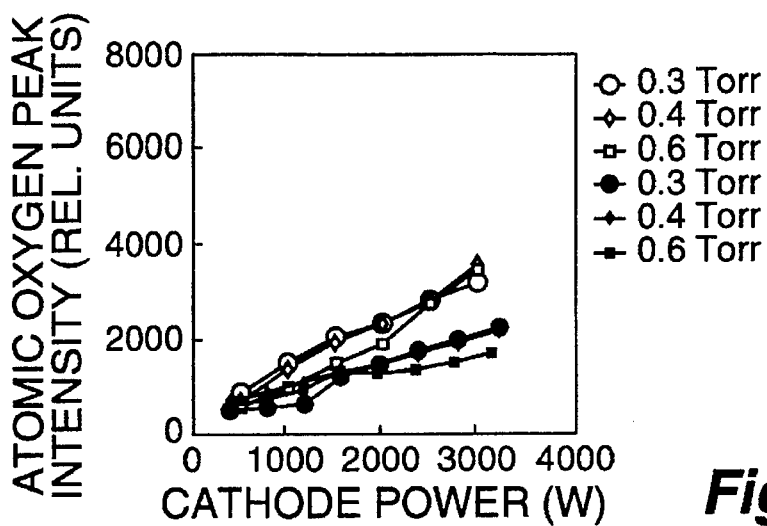
FIG. 8A is a graph of atomic oxygen emission versus AC cathode power at 90 kHz using no magnets.

FIG. 8A illustrates a comparison made between atomic oxygen peak intensity at different pressures and operation using AC power at 90 kHz and an aluminum base plate (open designations) and at operation using DC power and a 1/8 inch thick stainless steel base plate with 1/16 inch diameter openings (closed designations). No magnets were used.

Figure 8B:
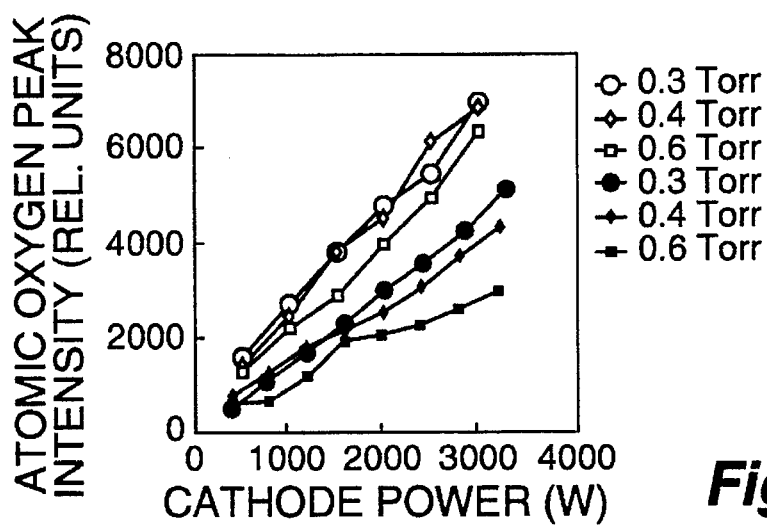
FIG. 8B is a graph of atomic oxygen emission versus AC cathode power at 90 kHz using magnets mounted beneath the substrate.

FIG. 8B illustrates a similar comparison using magnets mounted beneath the substrate.

Figure 8C:
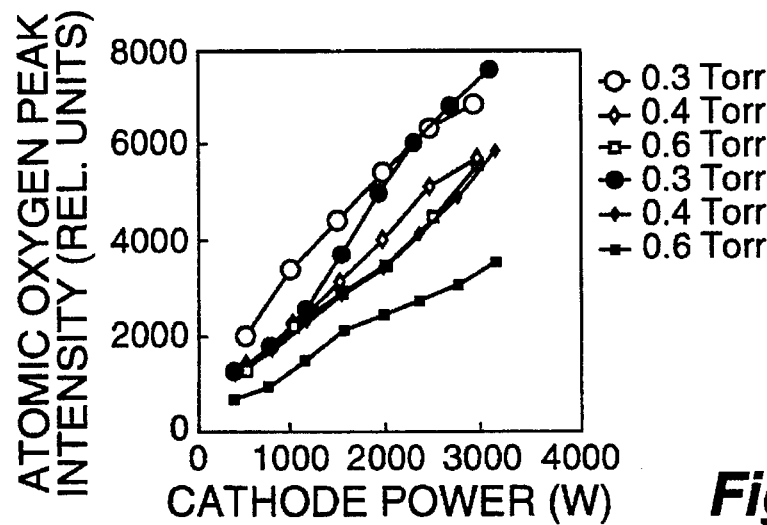
FIG. 8C is a graph of atomic oxygen emission versus AC cathode power at 90 kHz using magnets mounted above and beneath the substrate.

FIG. 8C illustrates a comparison made using magnets mounted both below the substrate and above the hollow cathode.

The highest atomic oxygen line intensities were obtained employing AC power frequencies in the range 60–100 kHz. Again, magnet assemblies enhanced the light intensities.

Table II below summarizes contact angle data obtained at varying power and line speeds when the aluminum foil was grounded.

TABLE II

| Sample | Power (kW) | Conveyor speed (in/min) | Plasma Exposure W.min/in | Contact angle, degree |
|---|---|---|---|---|
| 5 | 1.06 | 200 | 5.3 | 8 +/− 2 |
| 6 | 0.83 | 100 | 8.3 | 5 +/− 2 |
| 7 | 1.06 | 100 | 10.6 | 3 +/− 2 |
| 8 | 2.17 | 100 | 21.7 | 0 |

Thus a zero contact angle was obtained at a plasma exposure of 21.7 W.min/in, and a practical contact angle of 8 degrees was obtained at a plasma exposure of 5.3 W.min/in and conveyor speed of 200 in/min. It will also be apparent that grounding of the aluminum foil reduced the contact angle, or improved the cleaning of the foil.

EXAMPLE 4

The cleaning procedure of Example 3 was followed except using an AC power source with a grounded aluminum foil. The contact angle data are summarized in Table III below.

TABLE III

| Sample | AC Power (kW) | Conveyor speed, in/min | Plasma Exposure W.min/in | Contact angle, degrees |
| --- | --- | --- | --- | --- |
| 9 | 0.50 | 200 | 2.5 | 7 +/− 2 |
| 10 | 0.50 | 100 | 5.0 | 4 +/− 2 |
| 11 | 1.00 | 100 | 10.0 | 2 +/− 2 |
| 12 | 2.00 | 100 | 20 | 0 |

Thus a practical contact angle was achieved at a plasma exposure of only 2.5 W.min/in at a conveyor speed of 200 in/min.

The above plasma treatments can be combined with a thermal pretreatment of hydrocarbon coated metal sheet or foils. Thermal pretreatment volatilizes the low molecular weight fractions of the oils. In accordance with the invention, this volatilization step is followed by plasma cleaning using the hollow cathode array. Hydrocarbon oils can be removed at a rate of 1 mg/cm$^2$/min/kW.

Although the precursor gas used in the Examples was oxygen, other gases can also be used including nitrogen, air, water vapor, hydrogen, or with fluorinated gases, or an inert gas such as argon; mixtures of any of these gases can also be employed, such as air, mixtures of oxygen and argon and the like. Reducing gases such as hydrogen and mixtures thereof can be employed to remove oxides from metal sheet such as aluminum.

The relative distance between the substrate and the housing openings can vary depending on the housing material. Housings of different metals can be used depending upon whether AC or DC power is employed and whether magnetic enhancement is employed. In general, the further the substrate from the hollow cathode openings, the lower the etching rate, so the distance between them is generally maintained at from about 0.5–1.5 inch. Use of magnets beneath the substrate focusses the plasma emitted from the openings, and thus the distance between the substrate and the openings can be greater when magnets are employed. Since the performance of the hollow cathode is more stable at low gas pressures, and when using magnetic enhancement, a distance between the hollow cathode array openings and the substrate is preferably about 1.0 inch.

Figure 9:
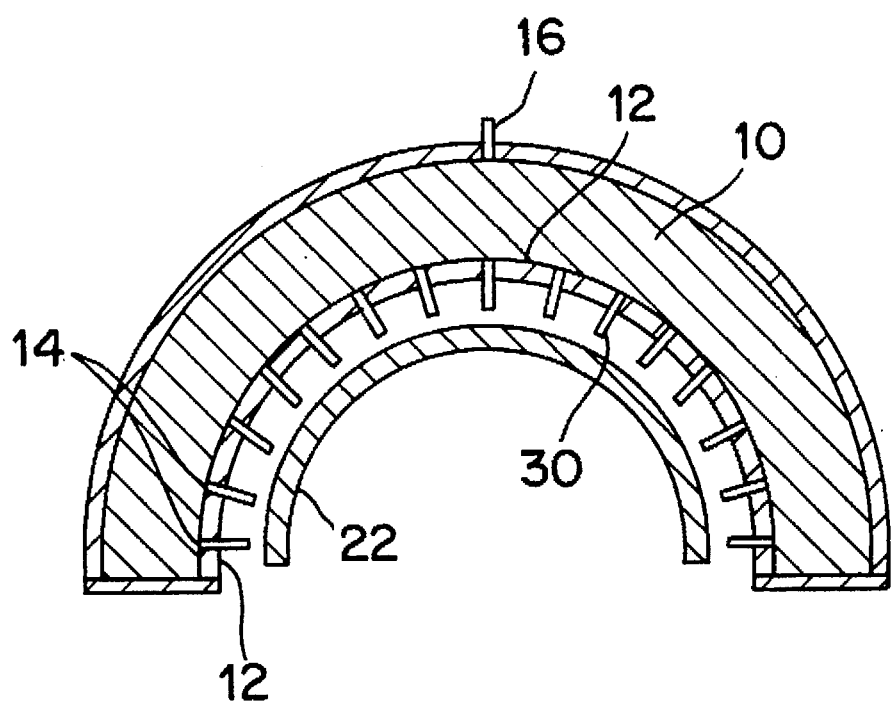
FIG. 9 is a cross sectional view of another hollow cathode array embodiment wherein the base plate and substrate are curved.

The hollow cathode array of the invention can also be shaped to accommodate a shaped substrate. FIG. 9 illustrates a substrate 22 having a semi-circular shape and a hollow cathode housing 10 also shaped as a semi-circle, so that a uniform distance between the substrate 22 and the torches 30 is maintained. It will be apparent that the substrate and the hollow cathode array housing can be of any shape, e.g., curved, ring-shaped, oblong and the like, provided that the shape of both the hollow cathode housing 10 and the substrate conform to each other so as to maintain a uniform spacing between the array of openings 14 and the substrate 22.

The hollow cathode array of the invention can also be used for plasma enhanced chemical vapor deposition processes using a generated plasma and the appropriate deposition precursor gases to deposit various films and coatings onto a substrate including metal sheet as above, by substituting deposition gases for the etchant gases illustrated above.

Although the present invention has been illustrated in terms of specific examples, the invention is not meant to be limited to the details set forth herein and equivalent materials and parts are meant to be included herein. For example, various other plasma processes can be carried out by using suitable plasma precursor gases and reaction conditions.

Further, various substrates can be substituted for the metal sheet stock discussed herein, such as polymeric films and glass plates. The invention is only meant to be limited by the scope of the appended claims.

We claim:

1. A hollow cathode array comprising a vacuum chamber;

a housing within said chamber having a plurality of uniformly spaced openings in a wall thereof, the size of the openings and the thickness of the housing wall chosen so that a plasma is generated within the housing and emitted from the housing through said openings;

a means of supplying a plasma precursor gas to said housing; and a means of supplying sufficient power to said housing to generate a plasma within said housing.

2. A hollow cathode array according to claim 1 wherein a substrate to be treated with said plasma discharge is mounted in said vacuum chamber parallel to and a preselected distance from said openings.

3. A hollow cathode array according to claim 2 wherein a first magnet assembly is mounted beneath said substrate.

4. A hollow cathode array according to claim 2 wherein a first magnet assembly is mounted above said substrate.

5. A hollow cathode array according to claim 3 wherein a second magnet assembly is mounted above said housing, said first and second magnet assemblies having opposite polarities.

6. A hollow cathode array according to claim 1 wherein said power source is an AC power source with a frequency from about 50 cycles per second to about 50 Megacycles per second.

7. A hollow cathode array according to claim 1 wherein said power source is an AC power source with a frequency from about 60 to about 100 kilohertz.

8. A hollow cathode array according to claim 1 wherein said power source is a DC power source.

9. A hollow cathode array comprising a vacuum chamber;

a housing having a plurality of uniformly spaced openings in a wall thereof, the size of the openings and the thickness of the housing wall chosen so that a plasma is generated within said housing and emitted from said housing through said openings;

a means of supplying a plasma precursor gas to said housing;

a means of supplying sufficient power to said housing to generate a plasma within said housing, wherein said power source is an AC power source with a frequency from about 50 cycles per second to about 50 Megacycles per second; and wherein two adjacent hollow cathodes are connected to a secondary coil of an isolation transformer.

10. A hollow cathode array according to claim 9 wherein the mid-point of said secondary coil is connected to ground through an impedance.

11. A hollow cathode array according to claim 9 wherein the mid-point of said secondary coil is shorted to ground.

12. A hollow cathode array according to claim 1 wherein said housing has cooling means affixed thereto.

13. A hollow cathode array according to claim 2 wherein said substrate is electrically floating.

14. A hollow cathode array according to claim 2 wherein said substrate is grounded.

* * * * *